United States Patent
Sakata et al.

(10) Patent No.: US 10,229,842 B2
(45) Date of Patent: Mar. 12, 2019

(54) DOUBLE SIDED BUFF MODULE FOR POST CMP CLEANING

(71) Applicant: Applied Materials, Inc., Santa Clara, CA (US)

(72) Inventors: Clinton Sakata, San Jose, CA (US); Hui Chen, Burlingame, CA (US); Jim K. Atkinson, Los Gatos, CA (US); Tomohiko Kitajima, Santa Clara, CA (US); Brian J. Brown, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1516 days.

(21) Appl. No.: 13/951,913

(22) Filed: Jul. 26, 2013

(65) Prior Publication Data
US 2015/0027491 A1 Jan. 29, 2015

(51) Int. Cl.
*H01L 21/67* (2006.01)

(52) U.S. Cl.
CPC .............. *H01L 21/67046* (2013.01)

(58) Field of Classification Search
CPC .................................. H01L 21/67046
See application file for complete search history.

(56) References Cited

U.S. PATENT DOCUMENTS

| 5,475,889 A * | 12/1995 | Thrasher | B08B 1/04 15/77 |
| 5,860,181 A * | 1/1999 | Maekawa | B08B 1/00 15/102 |
| 6,616,509 B1 * | 9/2003 | Frost | B24B 37/042 451/41 |
| 2014/0242885 A1 * | 8/2014 | Nakao | B24B 37/345 451/57 |

* cited by examiner

*Primary Examiner* — Spencer E Bell
(74) *Attorney, Agent, or Firm* — Patterson + Sheridan, LLP

(57) ABSTRACT

A buff module and method for using the same are provided. In one embodiment, a buff module includes housing having an interior volume, a plurality of drive rollers and a pair of buff heads. The drive rollers are arranged to rotate a substrate within the interior volume on a substantially horizontal axis. The buff heads are disposed in the housing, each buff head rotatable on an axis substantially aligned with the horizontal axis and movable to a position substantially parallel with the horizontal axis.

18 Claims, 4 Drawing Sheets

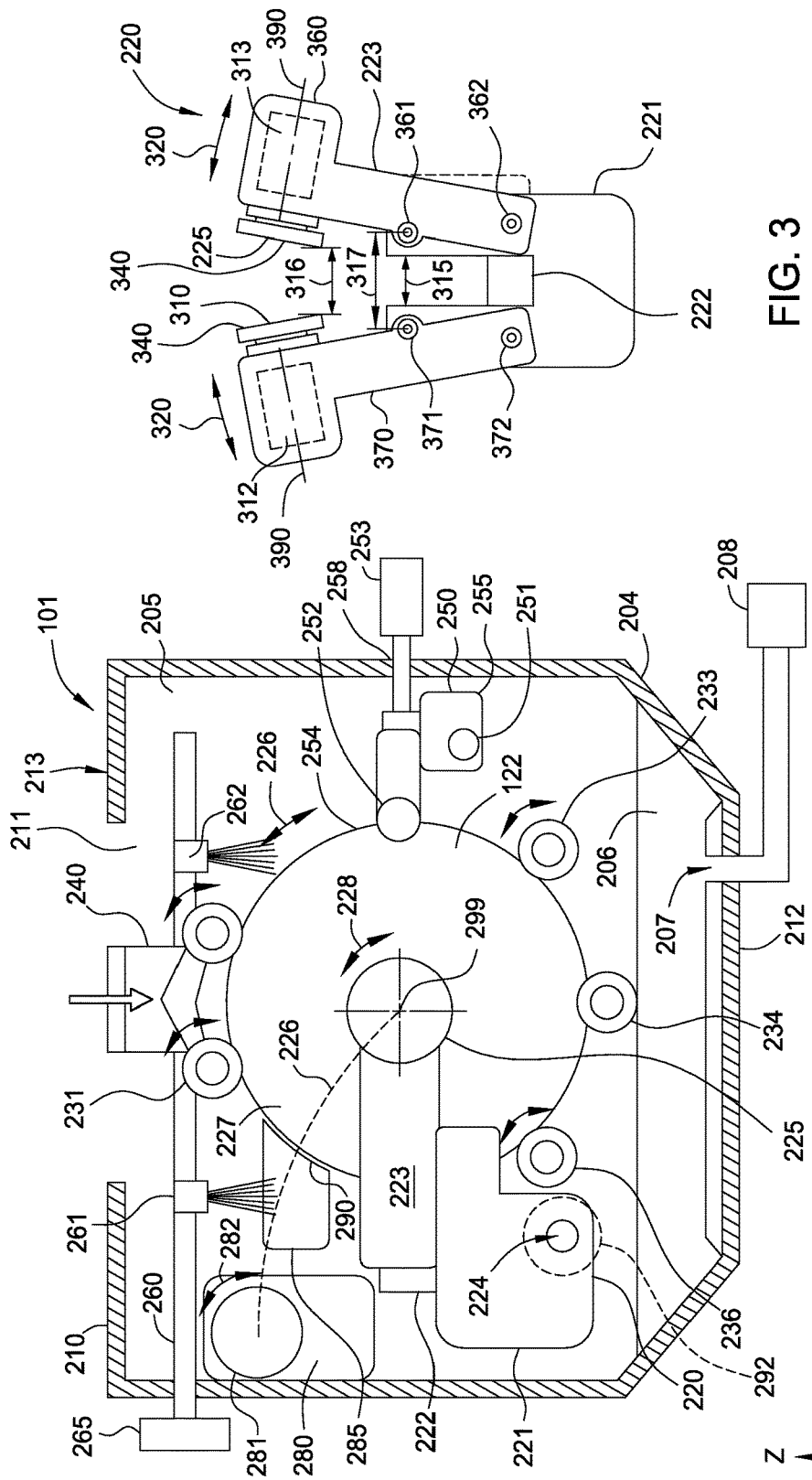

DOUBLE SIDED BUFF MODULE FOR POST CMP CLEANING

BACKGROUND OF THE INVENTION

Field of the Invention

Embodiments of the present invention generally relate to a method and apparatus for post chemical mechanical polishing (CMP) of semiconductor substrates.

Description of Related Art

In the process of fabricating modern semiconductor integrated circuits (ICs), it is necessary to develop various material layers over previously formed layers and structures. However, the prior formations often leave the topside surface topography unsuitable for subsequent layers of material. For example, when printing a photolithographic pattern having small geometries over previously formed layers, a shallow depth of focus is required. Accordingly, it becomes essential to have a flat and planar surface, otherwise, some of the pattern will be in focus while other parts of the pattern will not. In addition, if the irregularities are not leveled prior to certain processing steps, the surface topography of the substrate can become even more irregular, causing further problems as the layers stack up during further processing. Depending on the die type and the size of geometries involved, the surface irregularities can lead to poor yield and device performance. Consequently, it is desirable to achieve some type of planarization, or polishing, of films during IC fabrication.

One method for planarizing a layer during IC fabrication is chemical mechanical polishing (CMP). In general, CMP involves the relative movement of the substrate against a polishing material to remove surface irregularities from the substrate. The polishing material is wetted with a polishing fluid that typically contains at least one of an abrasive or chemical polishing composition. This process may be electrically assisted to electrochemically planarize conductive material on the substrate.

Once polished, the semiconductor substrate is transferred to a series of cleaning modules that remove the abrasive particles and/or other contaminants that cling to the substrate after polishing. The cleaning modules must remove any remaining polishing materials before they can harden on the substrate and create defects. These cleaning modules may include, for example, a megasonic cleaner, a scrubber or scrubbers, and a dryer.

Although present CMP cleaning modules have been shown to be robust and reliable systems, next generation devices have increased particle and defect reduction requirements. Meeting these requirements on current post CMP cleaning modules tends to result in high particle loading of brushes used in the scrubbers. This particle loading is particularly high on substrates with exposed metal layers as well as for certain slurries used in oxide processes. The impact of lower brush service life is undesirable and may also result in a greater number of defects found on the substrate surfaces, particularly at the edge or the bevel locations.

Therefore, there is a need in the art for an improved substrate cleaning module.

SUMMARY OF THE INVENTION

A buff module and method for using the same are provided. In one embodiment, a buff module includes a housing having an interior volume, a plurality of drive rollers and a pair of buff heads. The drive rollers are arranged to rotate a substrate within the interior volume on a substantially horizontal axis. The buff heads are disposed in the housing, each buff head rotatable on an axis substantially aligned with the horizontal axis and movable to a position substantially parallel with the horizontal axis.

In another embodiment, a method for buffing a substrate is provided that includes rotating a substrate in a housing on a substantially horizontal axis, spraying fluid on opposite surfaces of the substrate, contacting opposite surfaces of the substrate with buff heads rotating on a axis normal to a plane of the substrate, and moving the rotating buff heads across the opposite surfaces of the substrate.

BRIEF DESCRIPTION OF THE DRAWINGS

So that the manner in which the above recited embodiments of the invention are obtained and can be understood in detail, a more particular description of the invention, briefly summarized above, may be had by reference to the embodiments thereof, which are illustrated in the appended drawings. It is to be noted, however, that the appended drawings illustrate only typical embodiments of the invention, and are therefore not to be considered limiting of its scope, for the invention may admit to other equally effective embodiments.

FIG. 2 depicts a simplified cutaway view for the buff module shown in FIG. 1;

FIG. 3 is a partial top view of the buff module of FIG. 2;

To facilitate understanding, identical reference numerals have been used, wherever possible, to designate identical elements that are common to the Figures. Additionally, elements of one embodiment may be advantageously adapted for utilization in other embodiments described herein.

DETAILED DESCRIPTION

Embodiments for a buff module for use in a chemical mechanical planarizing (CMP) system and a method of using the same are provided. The buff module is configured to clean both sides of a substrate simultaneously while reducing the amount of defects found on a substrate surface after post CMP cleaning. The buff module includes dual buff heads containing either brushes or soft pads which simultaneously clean both sides of the substrate. The substrate may be oriented in either a substantially vertical or inclined position.

Figure 1:
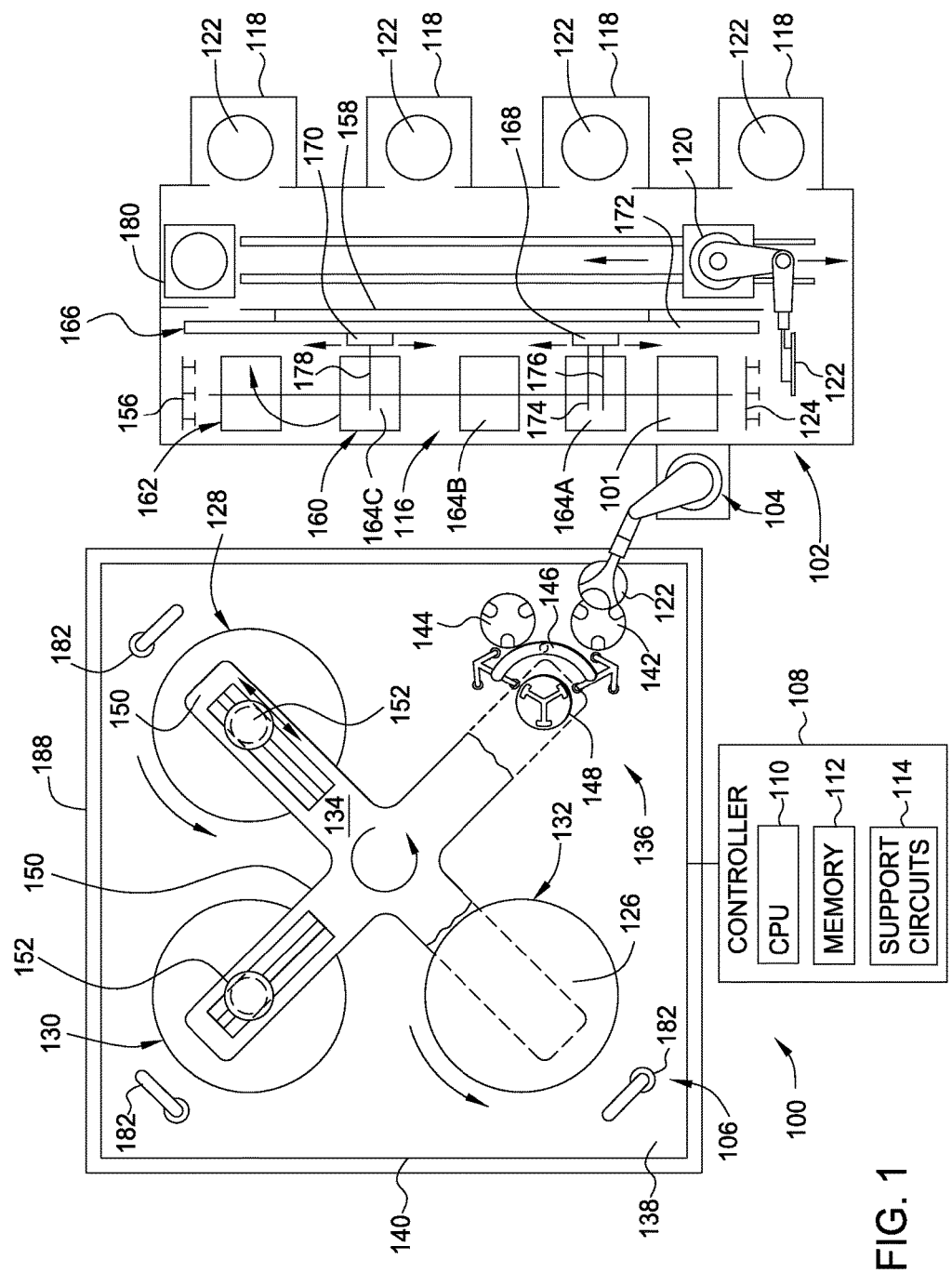
FIG. 1 illustrates a top view of a semiconductor substrate chemical mechanical planarization system having a cleaner that includes a buff module.

FIG. 1 is a plan view of an exemplary chemical mechanical planarization (CMP) system 100 having one embodiment of a buff module 101. The exemplary CMP system 100 generally comprises a factory interface 102, a loading robot 104, and a planarizing module 106. The loading robot 104 is disposed proximate the factory interface 102 and the planarizing module 106 to facilitate the transfer of substrates 122 therebetween.

A controller 108 is provided to facilitate control and integration of the modules of the CMP system 100. The controller 108 comprises a central processing unit (CPU) 110, a memory 112 and support circuits 114. The controller 108 is coupled to the various components of the CMP system 100 to facilitate control of, for example, the planarizing, cleaning and transfer processes.

The factory interface 102 generally includes one or more substrate cassettes 118 and a cleaner 116 that includes a buff module 101. An interface robot 120 is employed to transfer substrates 122 between the substrate cassettes 118, the cleaner 116 and an input module 124. The input module 124 is positioned to facilitate transfer of substrates 122 between the planarizing module 106 and the factory interface 102 by grippers, for example, vacuum grippers or mechanical clamps.

The planarizing module 106 includes at least one chemical mechanical planarizing (CMP) or electrochemical mechanical planarizing (CMP) station. In the illustration, the planarizing module 106 includes at least one chemical mechanical planarizing (CMP) station 128 disposed in an environmentally controlled enclosure 188. Examples of planarizing modules 106 that can be adapted to benefit from the invention include REFLEXION®, REFLEXION® LK, and REFLEXION® GT Chemical Mechanical Planarizing Systems, all available from Applied Materials, Inc. of Santa Clara, Calif. Other planarizing modules, including those that use processing pads, planarizing webs, or a combination thereof, and those that move a substrate relative to a planarizing surface in a rotational, linear or other planar motion may also be adapted to benefit from the invention.

In the embodiment depicted in FIG. 1, the planarizing module 106 includes one bulk CMP station 128, a second CMP station 130 and a third CMP station 132. Bulk removal of conductive material from the substrate is performed through a chemical mechanical planarization process at the bulk CMP station 128. After the bulk material removal at the bulk CMP station 128, residual conductive material is removed from the substrate at the residual CMP station 130 through a second chemical mechanical process. It is contemplated that more than one bulk CMP station 128 may be utilized in the planarizing module 106, for example, the second CMP Station 130.

An example of a conventional CMP process for the removal of copper is described in U.S. Pat. No. 6,451,697, issued Sep. 17, 2002. An example of a conventional CMP process for the barrier removal is described in U.S. patent application Ser. No. 10/187,857, filed Jun. 27, 2002. It is contemplated that other CMP processes may be alternatively performed. As the CMP stations are conventional in nature, further description thereof has been omitted for the sake of brevity.

The exemplary planarizing module 106 also includes a transfer station 136 and a carousel 134 that are disposed on an upper or first side 138 of a machine base 140. In one embodiment, the transfer station 136 includes an input buffer station 144, an output buffer station 142, a transfer robot 146 and a load cup assembly 148. The input buffer station 144 receives substrates from the factory interface 102 by the loading robot 104. The loading robot 104 is also utilized to return polished substrates from the output buffer station 142 to the factory interface 102. The transfer robot 146 is utilized to move substrates between the buffer stations 144, 142 and the load cup assembly 148.

In one embodiment, the transfer robot 146 includes two gripper assemblies, each having pneumatic gripper fingers that hold the substrate by the substrate's edge. The transfer robot 146 may simultaneously transfer a substrate to be processed from the input buffer station 144 to the load cup assembly 148 while transferring a processed substrate from the load cup assembly 148 to the output buffer station 142.

An example of a transfer station that may be used to advantage is described in U.S. Pat. No. 6,156,124, issued Dec. 5, 2000 to Tobin.

The carousel 134 is centrally disposed on the machine base 140. The carousel 134 typically includes a plurality of arms 150, each supporting a planarizing head assembly 152. Two of the arms 150 depicted in FIG. 1 are shown in phantom such that a planarizing surface 126 of the bulk CMP station 128 and the transfer station 136 may be seen. The carousel 134 is indexable such that the planarizing head assemblies 152 may be moved between the CMP stations 128, 132 and the transfer station 136. One carousel that may be utilized to advantage is described in U.S. Pat. No. 5,804,507, issued Sep. 8, 1998 to Perlov, et al.

A conditioning device 182 is disposed on the machine base 140 adjacent each of the CMP stations 128, 130, and 132. The conditioning device 182 periodically conditions the planarizing material disposed in the CMP stations 128, 130, 132 to maintain uniform planarizing results.

Optionally, substrates exiting the cleaner 116 may be tested in a metrology system 180 disposed in the factory interface 102. The metrology system 180 may include an optical measuring device, such as the NovaScan 420, available from Nova Measuring Instruments, Inc. located in Sunnyvale, Calif. The metrology system 180 may include a buffer station (not shown) for facilitating entry and egress of substrates from the optical measuring device or other metrology device. One such suitable buffer is described in U.S. Pat. No. 6,244,931, issued Jun. 12, 2001 to Pinson, et al.

The cleaner 116 removes polishing debris and/or polishing fluid from the polished substrates that remains after polishing. Substrates are generally moved through the plurality of cleaning modules 160 by the substrate handler 166 during cleaning. One cleaner that may be adapted to benefit from the present invention is described in U.S. patent application Ser. No. 10/286,404, filed Nov. 1, 2002. In one embodiment, the cleaner 116 includes a plurality of single substrate cleaning modules 160, as well as the input module 124, a dryer 162, and a substrate handler 166 disposed above the plurality of cleaning modules 160. The input module 124 serves as a transfer station between the factory interface 102, the cleaner 116 and the planarizing module 106. The dryer 162 dries substrates exiting the cleaner 116 and facilitates substrate transfer between the cleaner 116 and the factory interface 102. The dryer 162 may be a spin-rinse-dryer. In another example, a suitable dryer 162 may be found as part of the Reflexion® GT™ and Desica® Substrate Cleaner, both available from Applied Materials, Inc., of Santa Clara, Calif.

In the embodiment depicted in FIG. 1, the cleaner 116 includes four cleaning modules 160, shown as the buff module 101, a megasonic clearing module 164A, a first brush module 164B and a second brush module 164C. However, it is to be appreciated that the invention may be used with cleaning systems incorporating any number or specific types of modules. Each of the buff modules 101, 164A-C is configured to process a vertically oriented substrate, i.e., one in which the polished surface is in a substantially vertical plane, although the buff module 101 may also process an inclined substrate.

In operation, the CMP system 100 is initiated with a substrate 122 being transferred from one of the cassettes 118 to the input module 124 by the interface robot 120. The robot 104 then removes the substrate from the input module 124 and transfers it to the planarizing module 106, where the substrate is polished while in a horizontal orientation. Once the substrate is polished, the robot 104 extracts the substrate 122 from the planarizing module 106 and places it in the input module 124 in a vertical orientation. The substrate handler 166 retrieves the substrate from the input module 124 and indexes the substrate through at least one of the cleaning modules 160 of the cleaner 116. Each of the cleaning modules 160 is adapted to support a substrate in a vertical orientation throughout the cleaning process. Once cleaned, the substrate handler 166 transfers the substrate to the output module 156, where it is flipped to a horizontal orientation and returned by the interface robot 120 to one of the cassettes 118. In another embodiment, the dryer 162 may facilitate substrate transfer by tilting the substrate to a horizontal position and moving it upward for transfer to a cassette 118 by the interface robot 120. Optionally, the interface robot 120 or substrate handler 166 may transfer the substrates to the metrology system 180 prior to the substrate's return to the cassette 118.

The substrate handler 166 generally includes a first robot 168 and a second robot 170. The first robot 168 includes at least one gripper (two grippers 174, 176 are shown) and is configured to transfer the substrate between at least the input module 124 and the cleaning modules 160. The second robot 170 includes at least one gripper (a gripper 178 is shown) and is configured to transfer the substrate between at least one of the cleaning modules 160 and the dryer 162. Optionally, the second robot 170 may be configured to transfer the substrate between the dryer 162 and the metrology system 180. The substrate handler 166 includes a rail 172 coupled to a partition 158 separating the cassettes 118 and interface robot 120 from the cleaner 116. The robots 168, 170 are configured to move laterally along the rail 172 to facilitate access to the cleaning modules 160, dryer 162 and input module 124.

Figure 4:
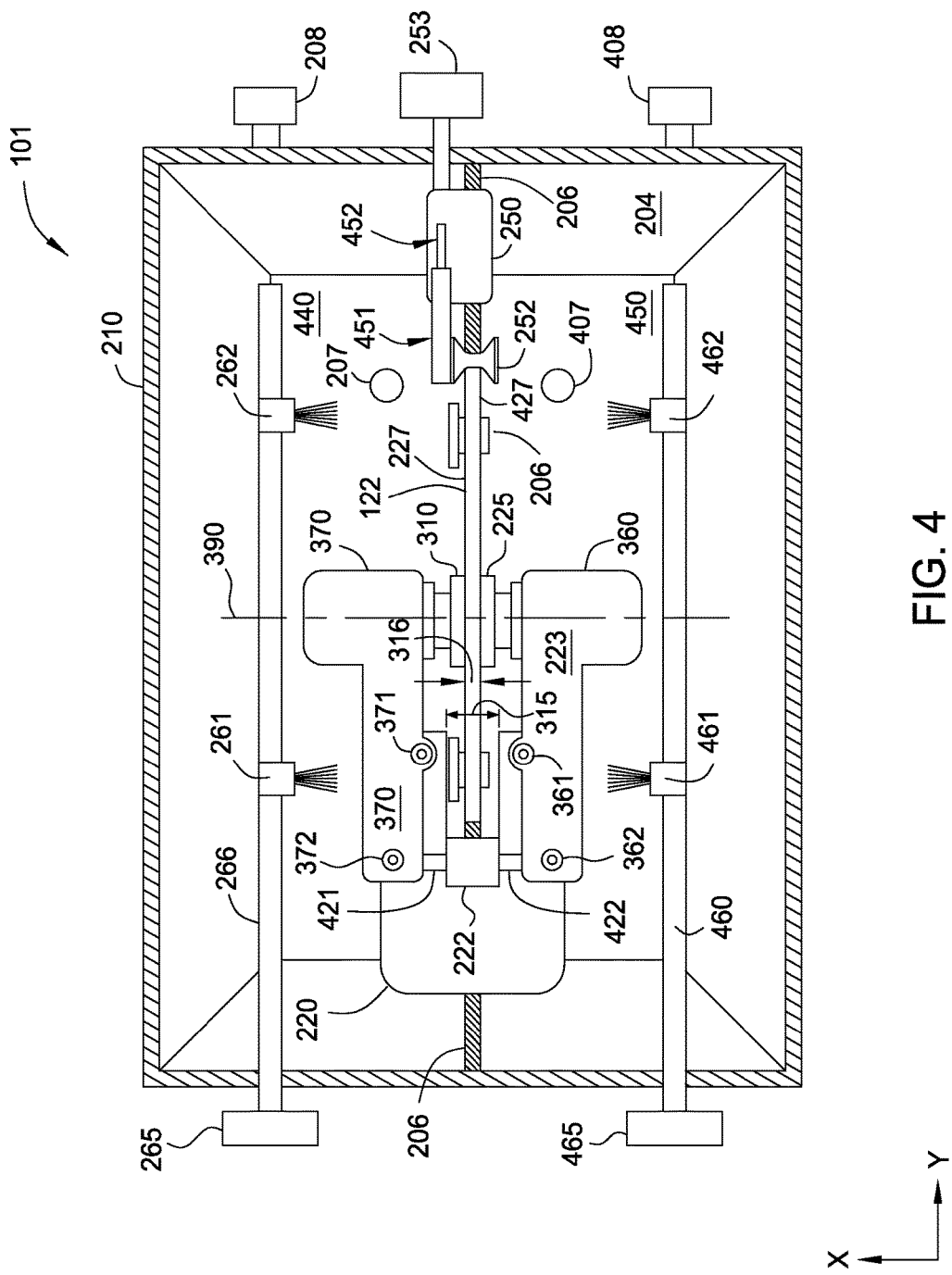
FIG. 4 depicts a simplified top down cutaway view of the buff module.
Figure 5:
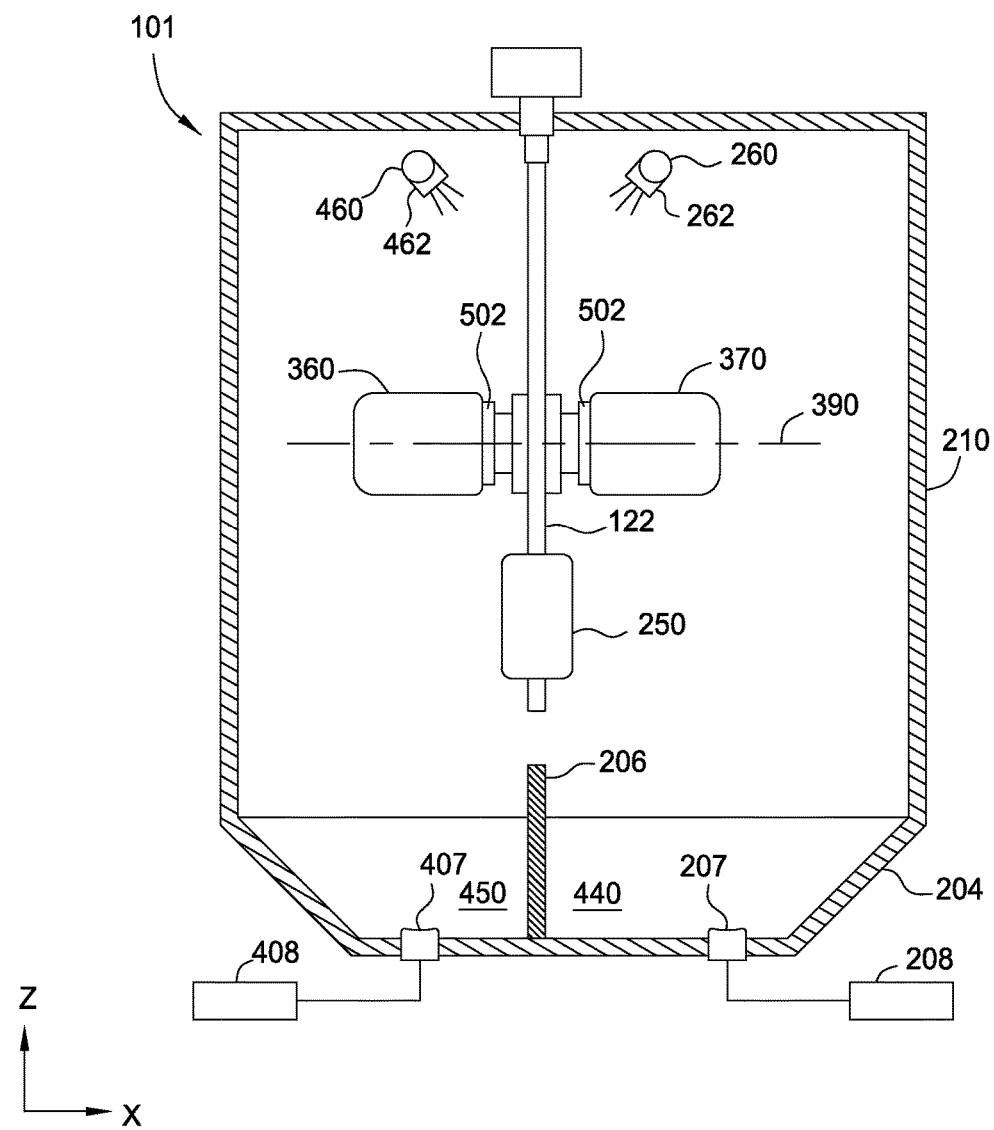
FIG. 5 depicts a simplified side cutaway view of the buff module.

In the embodiment depicted in FIG. 1, a substrate 122 enters the factory interface 102 after processing in the planarization module 106. The substrate 122 has remnants of materials from the CMP process and interface robot 120 moves the substrate 122 to the buff module 101 to remove CMP process materials from the substrate 122. The buff module 101 removes the process materials by simultaneously buffing the top and bottom of the substrate 122 along with cleaning the extreme edge of the substrate 122. FIG. 2 is provided to discuss and better understand the operations of the buff module 101. Additionally, FIGS. 3, 4 and 5 provide alternate views for the buff module 101 and are offered to provide additional details of the buff module 101.

FIG. 2 depicts a simplified cutaway view for the buff module 101 shown in FIG. 1. Some components of the buff module 101 have been omitted for the sake of clarity, and will be discussed later with reference to FIGS. 3, 4, and 5. The exemplary buff module 101 generally includes a housing 210 which surrounds and defines an interior volume 205. The housing 210 has a bottom 212 in which a drain 207 is formed and a top 213 with an opening 211. Disposed in the interior volume 205 are a double sided buffer 220, one or more spray bars 260, and a bevel edge cleaner 250.

The opening 211 is configured to allow the substrate handler 166 (shown in FIG. 1) to load the substrate 122 into the interior volume for a buff operation. Upon loading, the substrate 122 is supported by an open gap idler 234 and drive rollers 236, 233. The open gap idler 234 has a clearance to allow the substrate 122 to tilt while being loaded and unloaded from the buff module 101. Upon release by substrate handler 166, the substrate 122 rests in a vertical like fashion upon the open gap idler 234 and the drive rollers 236, 233.

An arm 240 having idlers 231 is provided at the top 213 of the housing 210. The arm 240 is movable so as to provide clearance at the opening 211 for the substrate 122 to enter and exit the interior volume 205. Upon the substrate 122 being disposed in the interior volume 205, the arm 240 moves the idlers 231 to a position that engages the idlers 231 with an edge 254 of the substrate 122. The force applied by the idlers 231 urges the substrate 122 against the open gap idler 234 and the drive rollers 233, 236. This secures the substrate 122 in a vertical like fashion for processing in the buff module 101. The force applied by the idlers 231 is sufficient to ensure rotation without slippage of the substrate and in one example may be between about 0.5 lbf to about 3 lbf. In one embodiment, the force applied by the idlers 231 to the substrate 122 is about 3 lbf.

The drive rollers 236 and 233 are driven on a substantially horizontal axis 299 by a motor or other suitable means to rotate the substrate 122. The idlers 231 may include a speed sensor to monitor the rotational speed of the substrate. The drive rollers 236, 233 may rotate the substrate from about 10 RPM to about 300 RPM. In one embodiment, the drive rollers rotate the substrate 122 at about 100 RPM.

After processing, the arm 240 removes the idlers 231 clear of the substrate 122 and opening 211. The substrate 122 loosely rests upon the drive rollers 233, 236 and the open gap idler 234, allowing the substrate handler 166 (not shown in FIG. 2) to remove the substrate 122.

As discussed above, the buff module 101 includes one or more spray bars 260 positioned to spray the substrate 122 disposed in the interior volume 205 with a fluid provided by a chemical source 265 through a plurality of nozzles 262. Although only one spray bar 260 is illustrated in FIG. 2, a second spray bar 460 may be positioned on the opposite side of the housing 210. The second spray bar 460 includes a plurality of nozzles 462 so that both sides of the substrate 122 may be advantageous maintained in a wet condition as shown in FIGS. 4 and 5. Continuing to refer to FIGS. 2, 4 and 5, the spray nozzles 262, 462 provide a fluid having a selected chemistry from the chemical source 265 to the surfaces of the substrate 122 during processing. One example of a suitable fluid provided by the chemical source 265 to the substrate 122 through the spray bars 260, 460 is highly purified water (HPW). However, it should be understood that the chemical source 265 may be configured to provide any number of different chemistries which may be selected in response to the process being performed in the substrate 122, or the properties of the substrate 122 (such as the exposed materials, critical dimensions, film stack, and the like) being processed in the buff module 101. For instance, possible chemistries may include ammonium hydroxide (0.5-5%), hydrogen peroxide (0.5-30%), citric acid (0.1-5%), tetramethyl ammonium hydroxide (0.5-5%), surfactants (10 ppm-1%), corrosion inhibitors, metal chelating agents, or other suitable agents. It is also contemplated that chemistries provided to a topside surface 227 of the substrate 122 through the spray nozzle 262 may be different than chemistries provided to a backside surface 427 of the substrate 122 through the spray bar 460 coupled to a second chemical source 465 (which may be optionally incorporated into a single chemical source 265).

The drain 207 form through the bottom 212 of the housing 210 is configured to remove the chemistries provided from the spray nozzles 262 and 462 from the interior volume 205 of the housing 210. In one embodiment, an optional partition 206 may extend upward from the bottom 212 of the housing 210. The partition 206 may be aligned with the idlers 231, 234 and drive rollers 233, 236 within the buff module 101.

The partition 206 divides the interior volume 205 along a plane substantially aligned with the substrate 122. Thus, when different chemistries are provided from the spray bars 260, 460 to respective opposing surfaces 227, 427 of the substrate 122, the different chemistries are collected substantially separately in the bottom 211 of the housing 210, allowing the separated chemistries to be removed from the interior volume 205 through separate drains 207, 407 for recycling and/or disposal.

For example, the bottom 212 of the housing 210 may be divided by the partition 206 into a first bottom region 440 and a second bottom region 450. The first bottom region 440 collects the chemistries sprayed onto topside surface 227 of the substrate, which are then removed from the first bottom region 440 by the drain 207. The second bottom region 450 collects the chemistries sprayed onto the backside surface 427 of the substrate 122, which are then removed from the second bottom region 450 by the drain 407. The chemistry exiting the housing 210 through the drain 407 may be collected in a reservoir 408. In this manner, different chemistries directed at the opposing surfaces 227, 427 of the substrate 122 may be collected separate from each other with minimal cross-contamination. In one embodiment, one or both of the chemistries collected in the reservoirs 208, 408 may be recycled, reused, or disposed of.

One advantage of providing different chemistries to opposing surfaces 227, 427 of the substrate 122 is that each chemistry may be selected to best clean the particular material exposed on the surface of the substrate, for example, silicon on the backside surface 427 and metal or oxide on the topside surface 227. Opposing surfaces 227, 427 of the substrate 122 may have also different properties, such as the coefficient of friction between the buffing head and substrate 122. The coefficient of friction for the opposing surfaces 227, 427 may vary between 0.1 to 0.5 µf dependent upon features exposed on the topside surface 227 and backside surface 427 materials (i.e. bare Si, glass, etc.). Thus, different chemistries may be provided to the substrate 122 from separate chemical sources 465 and 265 best suited to act upon the opposing surfaces 227, 427 instead of a single chemical source used throughout.

Returning back to FIG. 2, the double sided buffer 220 includes a housing 221, an arm 223, a pinch actuator 222, a translation actuator 292, and a buff head 225. The double sided buffer 220 rotates about a pivot axis 224. The buff head 225 may be movable a position proximate the center of the substrate 122 (Also the center of the circle defined by the idlers 231, 234 and drive rollers 233, 236). The buff head 225 may include contact surfaces comprised of brushes, soft pads or other materials suitable for cleaning the substrate 122. The contact surfaces (shown by reference numeral 340 in FIG. 3) have a generally planer surface and in one embodiment, has a circular profile. The buff head 225 may comprise a detachable disk comprised of either a magnetic or fastener-type clamp for replacement of the brushes or the pads. The brush or pad geometry may be disk shape, and have a diameter from about 5 mm to about 150 mm.

The buff head 225 is connected to the housing 221 by the arm 223. The translation actuator 292 is configured to rotate the housing 221 and arm 223 about the pivot axis 224. The rotation of the housing 221 about the pivot axis 224 causes the buff head 225 to travel along an arc 226 while processing the substrate 122. The buff head 225 may contain a gimble, (502 in FIG. 5), to compensate for run out and tolerance stackup of components to ensure the axis of rotation of the brushes is normal to the plane of the substrate 122. A support plate 285 is mounted adjacent to the edge 254 of the substrate 122 to prevent the pads or brushes of the buff heads 225 disposed on each side of the substrate 122 from coming into contact with each other when moving off the substrate edge 245. The support plate 285 is of similar thickness as the substrate 122 and has an arc-shaped edge 290 having a radius, originating at the axis 299, slightly greater that the radius of the substrate 122. The arc-shaped edge 290 is located such that its curvature is concentric with the center of rotation defined by the idlers 231, 234 and drive rollers 233, 236. As the buff head 225 travels along the arc 226 and processes the rotating substrate 122, the buff head 225 may move to a position beyond the edge 254 and onto the support plate 285. In this manner, the buff head 225 remains in a parallel orientation relative to the topside surface 227 of the substrate 122 and thus does not unduly remove material from the edge 254 of the substrate 122.

Referring now to the top view of the double sided buffer 220 shown in FIG. 3, the double sided buffer 220 has a second, or opposing, buff head 310 for the purpose of, in concert with buff head 225, simultaneously processing both sides of the substrate 122. A second arm 370 couples the second buff head 310 to the housing 221 so both buff heads 225, 310 may be simultaneously rotated about the axis 224 by the actuator 292. The double sided buffer 220 is depicted in an open position wherein a distance 316 between contact surfaces 340, i.e. the brushes or pads for the buff head 225 and the second buff head 310, is greater than a distance 315 of the width of the opening 211 formed in the housing 221. The arm 223 and second arm 370 rotate on a pivot 361 and 371 respectively.

The actuator 222 is attached to the arms 223, 370 by linkage rods (shown as 421 and 422 in FIG. 4) and pins 372 and 362. The actuator 222 rotates the arms 223, 370 about the pivots 361, 371 to move the buff head 225, 310 between a space apart that allows the substrate 122 to be robotically loaded into the buff module 101 and a pinched relation that places the buff heads 225, 310 in contact with the substrate for processing. The actuator 222 may be motorized or pneumatic and include a sensor (not shown) to provide feedback for control of the forces applied by the buff heads 225, 310 against the substrate 122

Briefly referring now to FIG. 4, the actuator 222 moves (extends) the linkage rod 421 attached to pin 372 and linkage rod 422 attached to pin 362. The arms 223 and 370 are fixed at pivot 361 and 371, respectively. As the linkage rods 421 and 422 are extended and displace pins 372 and 362 outwardly, the arm 223 and 370 respectively rotate about pivot 361 and 371. The rotation of the arms 223 and 370 cause the buff heads 225, 310 to come into contact with the substrate 122. In one embodiment, the actuator 222 moves linkage rod 421 and linkage rod 422 with equal force to balance the forces acting upon the substrate 122. However, the actuator 222 may move linkage rod 421 and linkage rod 422 independently, and the buff module 101 may be configured to manage the unbalanced forces by applying more pressure on the idlers 231 or by individually adjusting the rotational speed of the buff head 225 or second buff head 310. During the cleaning, the buff head 225 and second buff head 310 may apply contact pressures on the substrate 122 of about 0.5 kPa to about 25 kPa.

The position of the buff head 225 and second buff head 310 are matched to the same radius in respect to the substrate and position controlled by either a linear or rotary stage so as to provide cleaning coverage at the center of the substrate 122 to beyond the edge 254. As the buff head 225 and second buff head 310 move along the substrate 122 to the edge 254, the plate 285 (shown in FIG. 2) keeps the buff head 225 and second buff head 310 from contacting each other.

In addition to the rotation of the buff heads 225, 310 with respect to the axis 224, the buff head 225 and second buff head 310 also rotates on their axis 390 as shown by arrow 228 illustrated in FIG. 2 as well. Referring additionally to FIG. 3, a motor 313 drives buff head 225 and a motor 312 drives second buff head 310 about the axis 390. The rotation of the buff head 225 and second buff head 310 causes a force to act in a direction perpendicular the plane of rotation. In one embodiment the buff head 225 and second buff head 310 are rotated at a speed of about 0 RPM to about 3000 RPM. The buff head 225 rotation may be in a direction opposing the rotation of the second buff head 310. Thus, buff head 225 and second buff head 310 may be counter-rotating to balance torsional forces applied by the buff head 225, to the substrate 122. A torque sensor 311, 314 may provide a metric indicative of the torque applied by each buff head 225, 310 to the substrate so that the normal force on the substrate and/or rotational speed of the buff head 225, 310 may be adjusted to balance the level of torque on the substrate 122 so that the substrate maintains free rotation on the axis 299.

As mentioned earlier, the topside surface 227 of the substrate 122 may be dissimilar to the backside surface 427 and may have a different coefficient of friction. Therefore, alternatively or in addition to using alternate chemistries on opposite sides of the substrate 122, motor 313 may drive buff head 225 at an angular speed different from the angular speed of the second buff head 310 that is driven by motor 312. The difference in angular speed may be selected to balance the net forces acting on the substrate 122 due to different coefficients of friction on the opposing surfaces 227, 427 of the substrate 122.

A sequence for processing the substrate 122 using the double sided buffer 220 may be described with reference to FIG. 2. In one embodiment, a substrate 122 is moved into the buff module 101 by the substrate handler 166. The idlers 231 are moved in a position above the substrate 122 and apply a force of about 3 lbf on the edge 254 of the substrate to hold the substrate against the drive rollers 236, 233. The substrate 122 is rotated by the drive rollers 236, 233 as the rotating buff heads 225, 310, contact with the substrate 122. Chemistries are sprayed by the spray bars 260, 460 on the substrate 122 as the rotating buff heads 225, 310 of the double sided buffer 220 are translated across the opposing surfaces 227, 427 of the substrate 122 to clear the substrate 122 of strong adhered defects, (e.g. sub-50 nm slurry particles), and organic residue. Alternately, the chemistries may be provided directly from within the buff head 225, 310 to the opposing surfaces 227, 427 of the substrate 122 to limit the application of the chemistries only to the areas of the substrate 122 currently being in contact with the buff heads 225, 310.

Maintaining the condition of the buff heads 225, 310 helps ensure consistent process control. The buff heads 225, 310 may be conditioned and/or cleaned prior to and/or after processing of the substrate 122. A two sided pad conditioner 280 is provided to condition the brushes of the buff heads 225, 310. The two sided pad conditioner 280 conditions the buff head 225 and the second buff head 310 by cleaning and maintaining the brushes or pads, thus extending service lifetime for the buff heads 225, 310. The pad conditioner 280 includes a conditioning pad 281 having exposed conditioning surfaces on opposite sides of the pad conditioner 280. In one embodiment, the conditioning pad 281 may be a 2-sided brush or diamond disk mounted in a stationary position within the interior volume 205 of the buff module 101 that is within the range of the motion of the buff heads 225, 310, for example within the range of motion provided by the actuator 292 about the axis 224. In this example, the conditioning pad 281 may be located outward of the plate 285 on the sweep path of the buff heads 225, 310 relative to substrate 122. Alternatively, the plate 285 may be comprised of a surface material, such as quartz, for the purpose of cleaning or conditioning the buff heads 225, 310 in-situ.

Rotating the housing 221 along the arc 226 aligns the buff heads 225, 310 with the conditioning pad 281. The conditioning pad 281 may be driven by a motor (not shown) as shown by arrows 282 at an angular velocity for cleaning the buff heads 225, 310. Alternately, the conditioning pad 281 may not rotate and rely on the rotation of the buff heads 225, 310 about axis 390 to clean the buff heads 225, 310 upon contacting the conditioning pad 281.

The two sided pad conditioner 280 may also incorporate various chemistries in the conditioning process. These chemistries may come from the spray bars 260 or from within the two sided pad conditioner 280. Thus, the chemistry used on a first side of the two sided pad conditioner 280 may be different from a chemistry used on a second side of the two sided pad conditioner 280.

The buff module 101 also provides a means for cleaning the edge 254 of the substrate 122. The ability to clean the edge 254 of the substrate 122 may be provided by a bevel edge cleaner 250 or through positional control of the support plate 285 to control the engagement of the buff heads 225, 310 against the edge 254. In one embodiment a bevel edge cleaner 250 is provided with the ability to transit the bevel contour to within 5 mm from the edge 254 of the substrate 122.

The bevel edge cleaner 250 includes a housing 255, a cleaning head 252 and edge cleaner fluid supply 253. The housing 255 rotates about a pin 251, which causes the cleaning head 252 to come into, and out of, contact with the edge 254 of the substrate 122. The cleaning head 252 of the bevel edge cleaner 250 may contact the substrate 122 edge 254 with a pressure in the range of about 1 PSI to about 5 PSI. The cleaning head 252 may be a brush or pad, such as a portion of the polishing pad, and includes an edge configured to contact both sides of the substrate 122, for example, by having a groove or V-shaped notch in its circumference. Although it is shown without a motor, it is contemplated that the cleaning head 252 may be driven to rotate.

The edge cleaner fluid supply 253 provides chemistry for the bevel edge cleaner 250. The chemistries are applied through the cleaning head 252 to the substrate 122 edge 254. The chemistry supplied from the edge cleaner fluid supply 253 may be HPW or other suitable chemistries. Examples of other suitable chemistries may include ammonium hydroxide (0.5-5%), hydrogen peroxide (0.5-30%), citric acid (0.1-5%), tetramethyl ammonium hydroxide (0.5-5%), surfactants (10 ppm-1%), corrosion inhibitors, metal chelating agents, to name a few.

Thus, the present invention represents a significant advancement in the field of semiconductor substrate cleaning and polishing. The buff module is adapted to support and clean both sides of vertically oriented substrates, allowing it to be used in conjunction with cleaning systems that use minimal space. The simultaneous processing of both sides of the substrate cuts down on the number of overall processing steps while preparing the substrate for additional cleaning post CMP. Thus, saving downtime for maintenance of brushes. Additionally, processing both sides of the substrate simultaneously has the benefit of reducing the number of processing units necessary to clean the substrate and allowing the substrate to be processed at a faster rate.

While the foregoing is directed to embodiments of the present invention, other and further embodiments of the invention may be devised without departing from the basic scope thereof, and the scope thereof is determined by the claims that follow:

What is claimed is:

1. A buff module comprising:
   a housing having an interior volume;
   a plurality of drive rollers arranged to rotate a substrate within the interior volume on a substantially horizontal axis;
   a pair of buff heads disposed in the housing, each buff head rotatable on an axis substantially aligned with the horizontal axis and movable to a position substantially parallel with the horizontal axis; and
   a pad conditioner disposed in the interior volume and oriented perpendicular with and offset from the horizontal axis, the pad conditioner positioned to condition each of the buff heads simultaneously.

2. The buff module of claim 1, wherein the pad conditioner is rotatable.

3. A buff module comprising:
   a housing having an interior volume;
   a plurality of drive rollers arranged to rotate a substrate within the interior volume on a substantially horizontal axis;
   a pair of buff heads disposed in the housing, each buff head rotatable on an axis substantially aligned with the horizontal axis and movable to a position substantially parallel with the horizontal axis;
   at least two spray bars having at least one spray bar positioned to direct fluid to opposite sides of the substrate disposed on the drive rollers; and
   a partition configured to separate the interior volume of the housing into regions configured to separate different fluids provided to opposite sides of the substrate disposed on the drive rollers.

4. The buff module of claim 3, comprising:
   at least one fluid source coupled the spray bars, the at least one fluid source configured to provide different fluids to opposite sides of the substrate disposed on the drive rollers.

5. A buff module comprising:
   a housing having an interior volume;
   a plurality of drive rollers arranged to rotate a substrate within the interior volume on a substantially horizontal axis;
   a pair of buff heads disposed in the housing, each buff head rotatable on an axis substantially aligned with the horizontal axis and movable to a position substantially parallel with the horizontal axis; and
   a plate disposed in the interior volume and oriented perpendicular with and offset from the horizontal axis, the plate positioned between the buff heads to keep the buff heads from touching when the buff heads are translated away from the horizontal axis.

6. The buff module of claim 5, wherein the plate comprises:
   a curved edge having a radius originating at the horizontal axis.

7. The buff module of claim 5, wherein the plate is fabricated from quartz.

8. The buff module of claim 5, comprising:
   an actuator configured to sweep the buff heads about an actuator axis in a direction parallel to the horizontal axis, wherein the actuator axis is parallel with the horizontal axis.

9. The buff module of claim 8, wherein the actuator comprises:
   a range of motion configured to sweep the buff heads from a position substantially concentrically aligned with the horizontal axis to a position clear outside of a circumference of the drive rollers.

10. The buff module of claim 5, wherein each buff head comprises:
    a gimbal operable to allow the axis of rotation of the buff head to adjust in response to contact with the substrate.

11. The buff module of claim 5, wherein each buff head is configured to rotate at a speed independently controllable relative to a rotation speed of the other buff head.

12. The buff module of claim 5, wherein each buff head is configured to apply a torque to the substrate independently controllable relative to a torque applied to the substrate by the other buff head.

13. The buff module of claim 5, comprising:
    a bevel edge cleaner configured to contact both sides of the substrate simultaneously.

14. The buff module of claim 5, comprising:
    an idler movable between a first position capturing the substrate against the drive rollers and a second position allowing robotic removal of the substrate from the drive rollers.

15. The buff module of claim 5, comprising:
    a pair of arms each having one buff head coupled thereto, the arms having a first motion about an arm axis controlling a spacing between buff heads, and a second motion controlling a distance between the buff heads relative to the horizontal axis.

16. A method for buffing a substrate using the apparatus of claim 1, comprising:
    rotating a substrate in a housing on a substantially horizontal axis;
    spraying fluid on opposite surfaces of the substrate;
    contacting opposite surfaces of the substrate with buff heads rotating on an axis normal to a plane of the substrate; and
    moving rotating the buff heads across the opposite surfaces of the substrate.

17. The method of claim 16, wherein moving comprises:
    moving the rotating the buff heads beyond an edge of the substrate while still in contact with the substrate and while preventing contact between the buff heads.

18. The method of claim 16, wherein contacting comprises:
    balancing a torque applied by one buff head to the substrate against a torque applied by the other buff head to the substrate.

* * * * *